United States Patent
Miyao et al.

(10) Patent No.: US 10,865,498 B2
(45) Date of Patent: Dec. 15, 2020

(54) POLYCRYSTALLINE SILICON ROD, METHOD FOR PRODUCING POLYCRYSTALLINE SILICON ROD, AND SINGLE-CRYSTALLINE SILICON

(71) Applicant: SHIN-ETSU CHEMICAL CO., LTD., Tokyo (JP)

(72) Inventors: Shuichi Miyao, Niigata (JP); Shigeyoshi Netsu, Niigata (JP); Tetsuro Okada, Niigata (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 1 day.

(21) Appl. No.: 16/157,858

(22) Filed: Oct. 11, 2018

(65) Prior Publication Data

US 2019/0078230 A1 Mar. 14, 2019

Related U.S. Application Data

(62) Division of application No. 15/308,438, filed as application No. PCT/JP2015/002237 on Apr. 24, 2015, now abandoned.

(30) Foreign Application Priority Data

May 7, 2014 (JP) ................. 2014-096188

(51) Int. Cl.
*C30B 13/08* (2006.01)
*C01B 33/035* (2006.01)
(Continued)

(52) U.S. Cl.
CPC ............ *C30B 13/08* (2013.01); *C01B 33/035* (2013.01); *C30B 15/02* (2013.01); *C30B 29/06* (2013.01)

(58) Field of Classification Search
CPC ......... C30B 13/08; C30B 15/02; C30B 29/06; C01B 33/035
See application file for complete search history.

(56) References Cited

U.S. PATENT DOCUMENTS

| | | | |
|---|---|---|---|
| 5,935,320 A | 8/1999 | Graef et al. | |
| 5,976,481 A | 11/1999 | Kubota et al. | |

(Continued)

FOREIGN PATENT DOCUMENTS

| | | |
|---|---|---|
| CN | 1194624 A | 9/1998 |
| CN | 1547764 A | 11/2004 |

(Continued)

OTHER PUBLICATIONS

International Search Report dated Jun. 9, 2015 in PCT/JP2015/002237 (with English translation).

(Continued)

*Primary Examiner* — James A Fiorito
(74) *Attorney, Agent, or Firm* — Oblon, McClelland, Maier & Neustadt, L.L.P.

(57) ABSTRACT

In the present invention, once a polycrystalline silicon rod is grown by the Siemens process, the polycrystalline silicon rod is heat-treated within a temperature range from 750° C. to 900° C. to relieve residual stress in the crystal. According to the experiment of the present inventors, residual stress can be relieved satisfactorily by heat treatment at the above-described low temperature, and in addition, metal contamination cannot be induced and the physical properties of the polycrystalline silicon rod cannot be changed. The above heat treatment can be conducted inside a furnace used to grow the polycrystalline silicon rod, and can also be conducted outside a furnace used to grow the polycrystalline silicon rod. According to the present invention, a polycrys- (Continued)

talline silicon rod with residual stress (σ) of not more than +20 MPa evaluated by a 2θ-sin²Ψ diagram can be obtained.

1 Claim, 3 Drawing Sheets

(51) Int. Cl.
  *C30B 29/06* (2006.01)
  *C30B 15/02* (2006.01)

(56) References Cited

U.S. PATENT DOCUMENTS

| | | | |
|---|---|---|---|
| 6,221,155 | B1 | 4/2001 | Keck et al. |
| 2002/0014197 | A1 | 2/2002 | Keck et al. |
| 2003/0127045 | A1 | 7/2003 | Keck et al. |
| 2004/0192071 | A1 | 9/2004 | Kobayashi et al. |
| 2011/0177626 | A1* | 7/2011 | Depasa ............... C01B 33/021 438/14 |
| 2011/0229717 | A1 | 9/2011 | Kraus |
| 2012/0151969 | A1 | 6/2012 | Lichtenegger et al. |
| 2012/0175613 | A1 | 7/2012 | Netsu et al. |
| 2012/0227472 | A1 | 9/2012 | Depasa et al. |
| 2014/0037959 | A1 | 2/2014 | Wochner et al. |
| 2015/0037516 | A1 | 2/2015 | Netsu et al. |
| 2015/0047554 | A1 | 2/2015 | Miyao et al. |

FOREIGN PATENT DOCUMENTS

| | | |
|---|---|---|
| CN | 1769549 A | 5/2006 |
| CN | 102498064 A | 6/2012 |
| CN | 102555087 A | 7/2012 |
| CN | 103149326 A | 6/2013 |
| CN | 102190302 B | 9/2013 |
| EP | 2 695 974 A1 | 2/2014 |
| JP | 7-277874 A | 10/1995 |
| JP | 2002-508294 A | 3/2002 |
| JP | 3357675 B2 | 12/2002 |
| JP | 2004-277223 A | 10/2004 |
| JP | 2005-288332 A | 10/2005 |
| JP | 2013-217653 A | 10/2013 |
| JP | 2014-31297 A | 2/2014 |
| JP | 2014-34506 A | 2/2014 |
| TW | 589414 B | 6/2004 |
| WO | 97/44277 A1 | 11/1997 |
| WO | 2013/125208 A1 | 8/2013 |

OTHER PUBLICATIONS

Japanese Office Action dated Feb. 14. 2017 in Patent Application No. 2014-096188.

V. A. Popovich, et al., "Stress Measurement by X-Ray Diffraction in Multicrystalline Silicon Solar Cells" Conference Record of the IEEE Photo Voltaic Specialists Conference, vol. 37, 2011, pp. 1119-1123.

Extended European Search Report dated Oct. 27, 2017 in Patent Application No. 15788993.2, 21 pages.

Megan Mureen Dahl, "Characterization of Polycrystalline Silicon Grown in a Fluidized Bed Reactor", Master of science in Materials science and engineering, XP055416432, 2009, 81 pages.

* cited by examiner

[FIG. 1A]
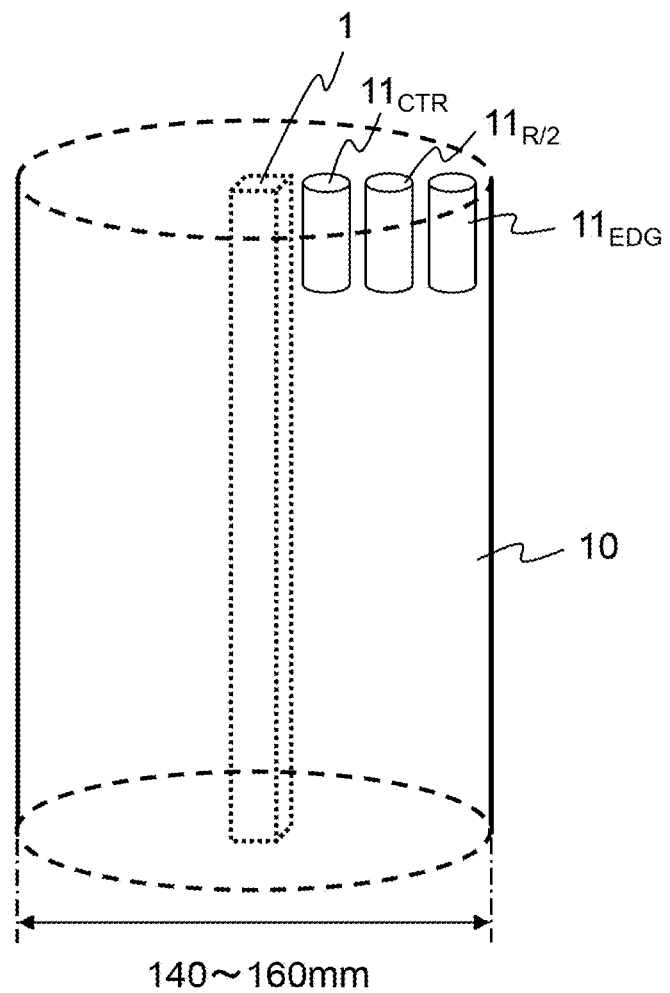
[FIG. 1B]
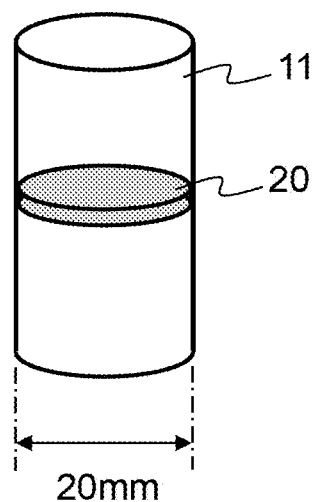

[FIG. 2A]
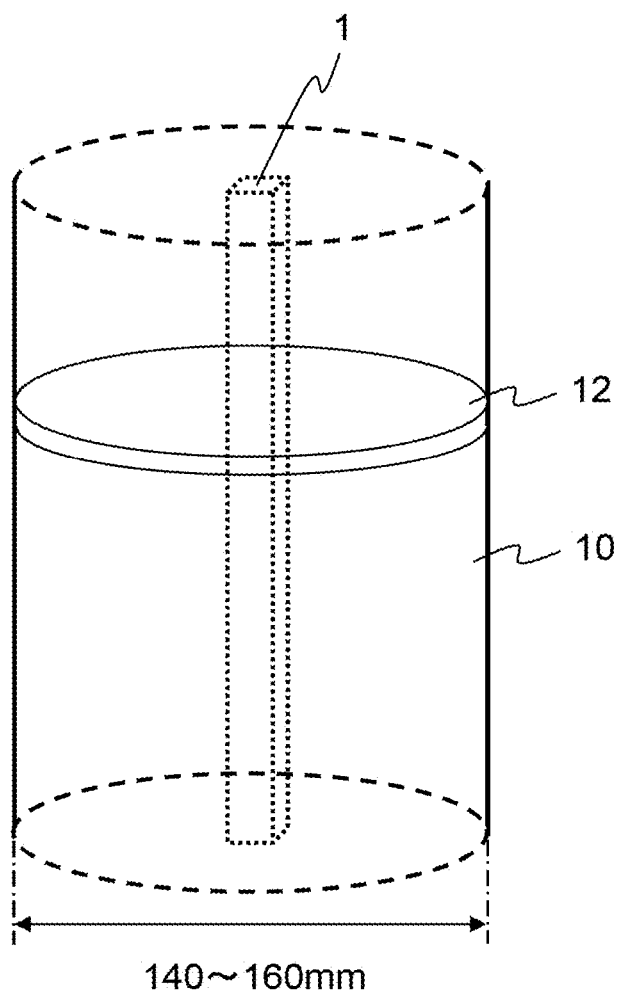
140~160mm
[FIG. 2B]
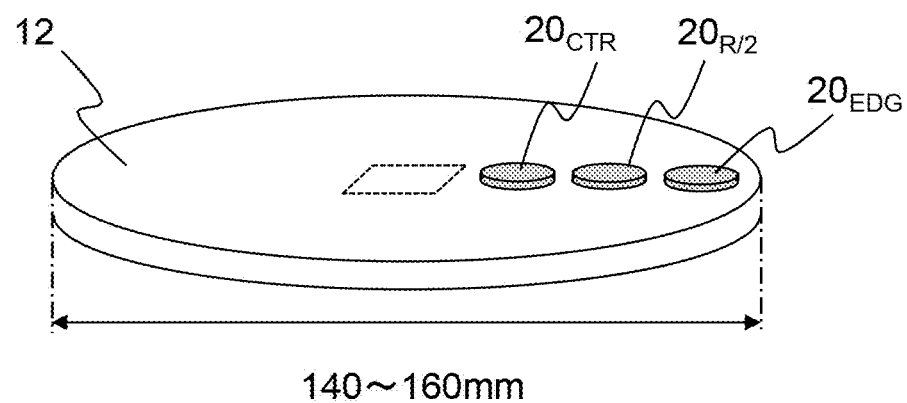
140~160mm

[FIG. 3A]
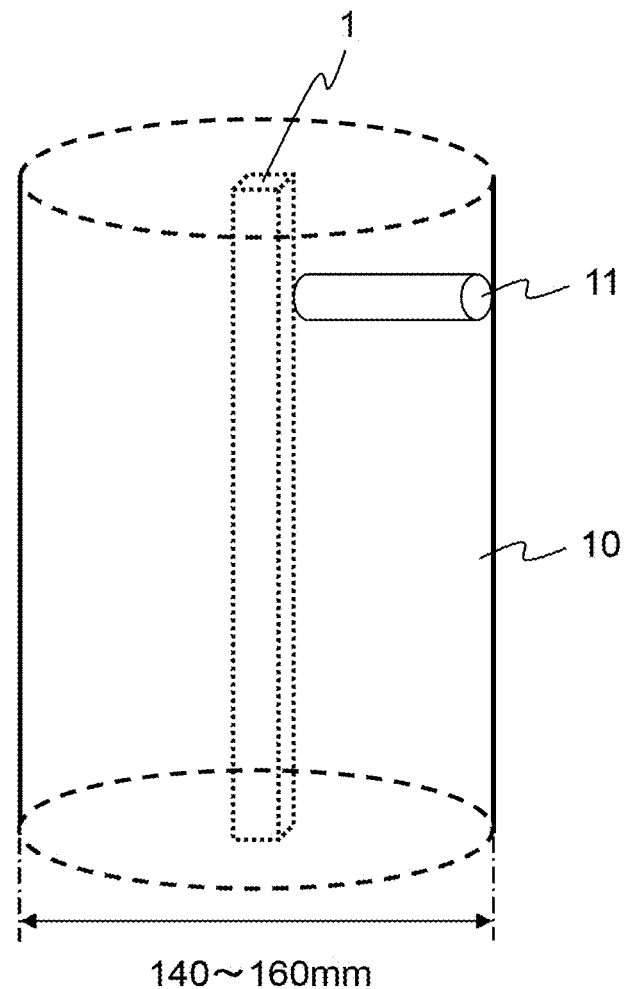
140~160mm
[FIG. 3B]
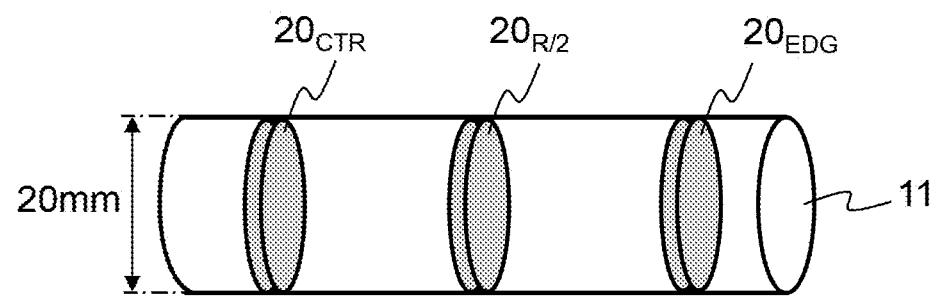

POLYCRYSTALLINE SILICON ROD, METHOD FOR PRODUCING POLYCRYSTALLINE SILICON ROD, AND SINGLE-CRYSTALLINE SILICON

CROSS REFERENCE TO RELATED APPLICATIONS

The present application is a Divisional application of U.S. application Ser. No. 15/308,438, filed on Nov. 2, 2016, which is a 35 U.S.C. § 371 national stage patent application of International patent application PCT/JP2015/002237, filed on Apr. 24, 2015, and claims the benefit of the filing date of Japanese application no. 2014-096188, filed on May 7, 2014, the text of each of which is incorporated by reference.

TECHNICAL FIELD

The present invention relates to a technique for growing a silicon crystal, and more particularly, relates to a technique for producing a polycrystalline silicon rod suitable for a raw material for producing single-crystalline silicon.

BACKGROUND ART

Single-crystalline silicon is necessary to produce, for example, semiconductor devices and in many cases, is grown by the FZ or CZ method using a polycrystalline silicon rod or polycrystalline silicon lump produced by the Siemens process as a raw material. The Siemens process is a process in which a source silane gas such as trichlorosilane or monosilane is brought into contact with a heated silicon core wire to conduct the vapor phase growth (deposition) of a polycrystalline silicon on the surface of the silicon core wire by CVD (Chemical Vapor Deposition) method.

As the diameter of the polycrystalline silicon increases during the deposition process by CVD, it gradually becomes difficult for an electric current, which flows through the core wire for heating-up, to flow through the outer surface of the polycrystalline silicon undergoing the deposition. As a result, the polycrystalline silicon has a lower temperature in and near the outer surface than in the central area. In such a situation, the progress of the deposition leads to the difference between the crystal properties in the outer area of the obtained polycrystalline silicon rod and the crystal properties in the central area. For example, the thermal expansion coefficients in the outer area and the central area of the crystal differ from each other, and thus, residual stress occurs in the crystal. As the diameter of the polycrystalline silicon rod increases, the above-described phenomenon occurs more significantly.

When single-crystalline silicon is grown by the CZ method, and where a polycrystalline silicon rod with a relatively large residual stress is used to recharge molten silicon, the polycrystalline silicon rod fractures in a furnace. In addition, when the above polycrystalline silicon rod is used as a raw material of single-crystalline silicon to be grown by the FZ method, the polycrystalline silicon rod may also fracture in a furnace during the crystal growth.

For example, Patent Literature 1 (Japanese Patent No. 3357675) states that a polycrystalline silicon rod made from trichlorosilane as a source material involves large residual stress, and therefore, has been believed to be unsuitable for the silicon rod used for the FZ method or recharging silicon. Furthermore, among other descriptions, Patent Literature 1 includes the description that, when the polycrystalline silicon rod is subjected to heat treatment such as annealing in order to relieve the residual stress of this polycrystalline silicon rod and subsequently is melted, the purity of the polycrystalline silicon rod is significantly reduced due to contamination, and the polycrystalline silicon rod is no longer able to be used for producing a single crystal.

In addition, Patent Literature 1 proposes a method of heating a polycrystalline silicon rod until at least a portion of the surface of the polycrystalline silicon rod reaches to a temperature of not less than 1030° C. in order to obtain a highly-pure polycrystalline silicon rod, wherein the highly-pure polycrystalline silicon rod has residual strain reduced to such an extent that no problems due to cracking can occur after the highly-pure polycrystalline silicon rod is supplied directly into a furnace for melting process when single-crystalline silicon for producing, e.g., a certain electronic device is manufactured such as by silicon-recharging process, and wherein the highly-pure polycrystalline silicon rod also has stable melting-properties.

Furthermore, in view of the problem that rod-shaped polycrystalline silicon undergoing heating and melting can fracture to cause the drop of the fractured parts when single-crystalline silicon made from rod-shaped polycrystalline silicon as a raw material is pulled up, Patent Literature 2 (Japanese Patent Laid-Open No. 7-277874) discloses an invention in which a rod-shaped polycrystalline silicon before melting process is subjected to heat treatment such as annealing to relieve residual stress of the rod-shaped polycrystalline silicon, so that the fracture of the rod-shaped polycrystalline silicon in melting process can be prevented in accordance with a finding that maximum residual stress of less than 3.5 kgf/mm$^2$ (a value determined under normal conditions) cannot result in the above-described fracture.

Moreover, Patent Literature 3 (Japanese Patent Laid-Open No. 2004-277223) discloses an invention in order to provide a high-strength silicon rod having a good cracking resistance that is expected to allow the prevention of cracking in a silicon-recharging process without heat treatment, wherein a polycrystalline silicon rod is produced by the Siemens process by controlling the surface temperature of the polycrystalline silicon rod from 950° C. to 1010° C., so that a high-strength polycrystalline silicon rod can be obtained and can have the tensile strength of not less than 90 MPa at normal temperature in the longitudinal direction.

CITATION LIST

Patent Literature

Patent Literature 1: Japanese Patent No. 3357675
Patent Literature 2: Japanese Patent Laid-Open No. 7-277874
Patent Literature 3: Japanese Patent Laid-Open No. 2004-277223
Patent Literature 4: Japanese Patent Laid-Open No. 2013-217653
Patent Literature 5: Japanese Patent Laid-Open No. 2014-31297
Patent Literature 6: Japanese Patent Laid-Open No. 2014-34506

SUMMARY OF INVENTION

Technical Problem

Unfortunately, in Patent Literature 1 (Japanese Patent No. 3357675), at least a portion of the surface of the polycrystalline silicon rod has to be heated at a relatively high temperature of not less than 1030° C., and heat treatment at such a high temperature may change the physical properties (such as crystal grain size distribution and thermal diffusivity) of the polycrystalline silicon rod after the heat treatment relative to the physical properties of the polycrystalline silicon rod before the heat treatment.

Patent Literature 2 (Japanese Patent Laid-Open No. 7-277874) proposes to relieve the residual stress by heat treatment such as annealing before melting process; however, the detail of specific conditions for the residual-stress relief is not disclosed.

With reference to the method disclosed in Patent Literature 3 (Japanese Patent Laid-Open No. 2004-277223), the polycrystalline silicon rod is heat-treated at a temperature (from 950° C. to 1010° C.) lower than the temperature for the heat-treatment described in Patent Literature 1. Unfortunately, when the polycrystalline silicon rod is heat-treated at the temperature from 950° C. to 1010° C., the physical properties of the polycrystalline silicon rod may be changed relative to the physical properties of the polycrystalline silicon rod before the heat treatment.

The present invention has been made in view of the above problems, and therefore, an object of the present invention is to provide a method for releasing and relieving residual stress in a polycrystalline silicon rod without changing the physical properties of the polycrystalline silicon rod after a growing process, so that the polycrystalline silicon rod has residual strain reduced to such an extent that no problems due to cracking can occur when single-crystalline silicon used for producing, e.g., a certain device is manufactured such as by silicon-recharging process.

Solution to Problem

To solve the above problems, a polycrystalline silicon rod according to the present invention is a polycrystalline silicon rod grown by the Siemens process having a residual stress (σ) of not more than +20 MPa, wherein the residual stress is given by the formulae shown below and evaluated by the slope $(\Delta(2\theta)/\Delta(\sin^2\Psi))$ of a straight line by least fitted to data points square approximation which are obtained by X-ray diffraction and plotted onto a $2\theta-\sin^2\Psi$ diagram.

$\sigma$ (MPa)=$K \cdot [\Delta(2\theta)/\Delta(\sin^2\Psi)]$, and $K=-(E/2(1+v)) \cdot \cot\theta_0 \cdot \pi/180$, in which $\Psi$: an angle (deg.) between sample-surface normal and lattice-plane normal, $\theta$: a diffraction angle (deg.), K: stress constant (MPa/deg.), E: Young's modulus (MPa), v: Poisson's ratio, and $\theta_0$: a Bragg angle (deg.) in strain-free state.

Preferably, the polycrystalline silicon rod is heat-treated within a temperature range from 750° C. to 900° C. for stress relief.

Furthermore, the polycrystalline silicon rod after the heat treatment preferably retains a crystal grain size distribution and a thermal diffusivity before the heat treatment.

A method of producing a polycrystalline silicon rod according to the present invention comprises a step of growing a polycrystalline silicon rod by the Siemens process, followed by heat-treating the polycrystalline silicon rod at a temperature ranging from 750° C. to 900° C. for stress relief.

For example, the heat treatment is conducted inside a furnace used to grow the polycrystalline silicon rod.

Alternatively, for example, the heat treatment is conducted outside a furnace used to grow the polycrystalline silicon rod.

A single-crystalline silicon according to the present invention is grown using polycrystalline silicon as a raw material obtained from the above polycrystalline silicon rod.

Advantageous Effect of Invention

With reference to the present invention, in accordance with a new finding of the present inventors that residual stress in a polycrystalline silicon rod grown by the Siemens process can be relieved by heat treatment at a relatively low temperature within a temperature range from 750° C. to 900° C., a polycrystalline silicon rod with residual stress (σ) of not more than +20 MPa evaluated by X-ray diffraction is provided.

BRIEF DESCRIPTION OF DRAWINGS

FIG. 1A is a diagram for illustrating a first example of sampling a plate-shaped sample for determining residual stress by X-ray diffraction from a polycrystalline silicon rod.

FIG. 1B is a diagram for illustrating a first example of sampling a plate-shaped sample for determining residual stress by X-ray diffraction from a polycrystalline silicon rod.

FIG. 2A is a diagram for illustrating a second example of sampling a plate-shaped sample for determining residual stress by X-ray diffraction from a polycrystalline silicon rod.

FIG. 2B is a diagram for illustrating a second example of sampling a plate-shaped sample for determining residual stress by X-ray diffraction from a polycrystalline silicon rod.

FIG. 3A is a diagram for illustrating a third example of sampling a plate-shaped sample for determining residual stress by X-ray diffraction from a polycrystalline silicon rod.

FIG. 3B is a diagram for illustrating a third example of sampling a plate-shaped sample for determining residual stress by X-ray diffraction from a polycrystalline silicon rod.

DESCRIPTION OF EMBODIMENTS

Hereinbelow, a polycrystalline silicon rod according to the present invention and a method of producing the polycrystalline silicon rod are illustrated with reference to the drawings.

One of methods of determining residual stress in a crystal is X-ray diffraction. When a crystal includes stress, the distance between crystal lattice planes d varies in proportion to the degree of the stress. In particular, the presence of tensile stress leads to a larger distance between lattice planes, and the presence of compressive stress leads to a smaller distance between lattice planes.

If a crystal plane induces Bragg diffraction, the diffraction angle of the crystal plane θ meets Bragg conditions ($n\lambda = 2d \cdot \sin\theta$). Therefore, if the wave length of X-ray λ is constant, diffraction angle 2θ varies according to change in the distance between lattice planes d.

Residual stress σ in a crystal is given by the formula shown below from the slope $(\Delta(2\theta)/\Delta(\sin^2\Psi))$ of a straight line fitted to data points by least square approximation which are obtained by X-ray diffraction and plotted onto a $2\theta-\sin^2\Psi$ diagram.

$$\sigma(\text{MPa}) = K \cdot [\Delta(2\theta)/\Delta(\sin^2\Psi)] \quad (1)$$

Here, Ψ is an angle (deg.) between a sample-surface normal and a lattice-plane normal. Furthermore, K is a stress constant (MPa/deg.), and is given by the following formula (2).

$$K = -(E/2(1+\nu)) \cdot \cot \theta_0 \cdot \pi/180 \qquad (2)$$

It is noted that E in the above formula (2) is Young's modulus (MPa), ν is Poisson's ratio, and $\theta_0$ is a Bragg angle (deg.) in a strain-free state.

In other words, when X-ray diffraction is used to observe the behavior of a certain diffraction peak while changing lattice-plane normal, internal stress can be determined from the degree of expansion and contraction of the distance between lattice planes.

In particular, the absence of the internal stress definitely leads to no shift of diffraction peak occurring, and the presence of compressive stress leads to the shift of diffraction peak to higher angle, and the presence of tensile stress leads to the shift of diffraction peak to the lower angle direction.

In general, residual stress within a polycrystalline silicon rod becomes smaller depending on the growth of the polycrystalline silicon rod by the Siemens process under thermally uniform environment. Furthermore, heat treatment for relieving residual stress is disclosed as a known method in Patent Literatures 1 and 3.

However, heat treatment at a relatively high temperature, for example a temperature above 950° C. may cause metal contamination, and in addition, the physical properties (such as crystal grain size distribution and thermal diffusivity) of a polycrystalline silicon rod may be changed after the heat treatment.

In accordance with the study of the present inventors, the following phenomena have been confirmed: the intensity of X-ray diffraction from Miller index plane such as <111> and <220> is changed after the heat treatment, and also, the crystal grain size distribution is changed due to larger average grain size resulted from heat treatment, and also, thermal conductivity and thermal diffusivity are changed after the heat treatment. In addition, the above-described change is an irreversible change and the value before the heat treatment cannot be recovered, and thus, a polycrystal with desired physical properties is less likely to be obtained even after residual stress relief.

Therefore, the present inventors have studied a method of relieving the residual stress of a polycrystalline silicon rod with retaining the physical properties of the polycrystalline silicon rod, and thus, the present invention has been made.

In the present invention, once a polycrystalline silicon rod is grown by the Siemens process, this polycrystalline silicon rod is heat-treated at a temperature range from 750° C. to 900° C. to relieve residual stress inside the crystal.

Heat treatment is conducted at a relatively lower temperature in comparison to heat treatment for residual stress relief which is a known method in itself, and heat treatment at not less than 1030° C. disclosed in Patent Literature 1 and heat treatment from 950° C. to 1010° C. disclosed in Patent Literature 3. According to the experiment of the present inventors, residual stress can be relieved satisfactorily by heat treatment at the above-described low temperature, and in addition, metal contamination cannot be induced and the physical properties of the polycrystalline silicon rod cannot be changed. In other words, the polycrystalline silicon rod after the heat treatment retains crystal grain size distribution and thermal diffusivity before the heat treatment.

The above heat treatment can be conducted inside a furnace used to grow the polycrystalline silicon rod, and can also be conducted outside a furnace used to grow the polycrystalline silicon rod.

According to the present invention, a polycrystalline silicon rod with residual stress (σ) of not more than +20 MPa evaluated by the above $2\theta\text{-}\sin^2\Psi$ diagram can be obtained. When this polycrystalline silicon rod is used as a raw material to grow single-crystalline silicon, the polycrystalline silicon rod cannot fracture inside a furnace for growing single-crystalline silicon by the CZ or FZ method, and thus, high-quality single-crystalline silicon can be obtained.

[Sampling of Samples to be Evaluated]

FIG. 1A and FIG. 1B are diagrams for illustrating an (first) example of sampling a plate-shaped sample 20 for determining residual stress by X-ray diffraction, from a polycrystalline silicon rod 10 grown through deposition by chemical vapor deposition such as the Siemens process.

FIG. 2A and FIG. 2B are diagrams for illustrating an (second) example of sampling a plate-shaped sample 20 for determining residual stress by X-ray diffraction.

FIG. 3A and FIG. 3B are diagrams for illustrating an (third) example of sampling a plate-shaped sample 20 for determining residual stress by X-ray diffraction.

A reference sign 1 shown in the drawings means a silicon core wire to be formed into a silicon rod by depositing polycrystalline silicon onto the surface of the silicon core wire. The diameter of a polycrystalline silicon rod 10 illustrated in the above-described figures is approximately from 140 mm to 160 mm, and a plate-shaped sample 20 is sampled from the polycrystalline silicon rod 10 to determine residual stress. It is noted that a location for sampling a plate-shaped sample 20 is not limited to those shown in the drawings.

With reference to a first example shown in FIG. 1A, rods 11 with a diameter of approximately 20 mm are hollowed out from three domains, that is, a domain ($11_{CTR}$) close to a silicon core wire 1 from a viewpoint in a plane perpendicular to the longitudinal direction of a polycrystalline silicon rod 10, as well as a domain ($11_{EDG}$) close to a side surface of the polycrystalline silicon rod 10, and a domain ($11_{R/2}$) in the middle point between CTR and EDG. Then, as shown in FIG. 1B, disk-shaped samples 20 with the thickness of approximately 2 mm are sampled from the above rod 11. The disk-shaped sample 20 sampled from the rod $11_{CTR}$ is denoted as $20_{CTR}$, the disk-shaped sample 20 sampled from the rod $11_{R/2}$ is denoted as $20_{R/2}$, and the disk-shaped sample 20 sampled from the rod $11_{EDG}$ is denoted as $20_{EDG}$.

As a result, disk-shaped samples are sampled from a cross-sectional domain perpendicular to the longitudinal direction of the polycrystalline silicon rod 10. Residual stress in the growth direction (rr) and residual stress in the direction (θθ) with an angle of 90° to this growth direction can be determined by suitably selecting an area to be irradiated with X-ray on a principal surface of this disk-shaped sample through a slit.

In a second example shown in FIG. 2A, firstly, a polycrystalline silicon rod 10 is sliced in the direction perpendicular to the longitudinal direction in order to sample a disk 12 having a silicon core wire 1 as a central part. Then, as shown in FIG. 2B, disk-shaped samples ($20_{CTR}$, $20_{R/2}$, and $20_{EDG}$) with a diameter of approximately 20 mm are hollowed out from three domains of the above disk 12, that is, a domain close to the silicon core wire 1, a domain close to a side surface of the polycrystalline silicon rod 10, and a domain in the middle point between CTR and EGD.

As a result, disk-shaped samples are also sampled from a cross-sectional domain perpendicular to the longitudinal direction of the polycrystalline silicon rod 10. Residual stress in the growth direction (rr) and residual stress in the direction (θθ) with an angle of 90° to this growth direction can be determined by suitably selecting an area to be irradiated with X-ray on a principal surface of this disk-shaped sample through a slit.

With reference to a third example shown in FIG. 3A, firstly, a rod 11 with a diameter of approximately 20 mm is hollowed out from a polycrystalline silicon rod 10 in the direction perpendicular to the longitudinal direction. Then, as shown in FIG. 3B, a disk-shaped samples ($20_{CTR}$, $20_{R/2}$, and $20_{EDG}$) with a diameter of approximately 20 mm are sampled from three domains of the above rod 11, that is, a domain close to a silicon core wire 1, a domain close to a side surface of a polycrystalline silicon rod 10, and a domain in the middle point between CTR and EGD.

As a result, disk-shaped samples are sampled from a cross-sectional domain parallel to the longitudinal direction of the polycrystalline silicon rod 10. Residual stress in the longitudinal direction (zz) can be determined by suitably selecting an area to be irradiated with X-ray on a principal surface of this disk-shaped sample through a slit.

It is noted that a domain for sampling a rod 11 as well as the length and number of this rod can be appropriately specified according to the diameter of a silicon rod 10 and the diameter of the hollowed out rod 11. Although a disk-shaped sample 20 can be sampled from any domain of the hollowed out rod 11, the disk-shaped sample 20 is preferably sampled from a domain that allows reasonable estimation of the nature regarding to the entire silicon rod 10.

Furthermore, the diameter of the disk-shaped sample 20 is indicated to be approximately 20 mm only for the purpose of illustration, and this diameter can be appropriately specified as long as no problems occur in the determination of residual stress.

[Stress Determination by X-Ray Diffraction]

In order to determine residual stress in the above-described three directions, that is, rr direction, θθ direction and zz direction, disk-shaped samples with a diameter of 19 mm and a thickness of 2 mm were sampled. The obtained disk-shaped samples were positioned so as to detect Bragg reflection from Miller index plane <331>. Then, a slit was provided so that an area to be irradiated with X-ray would be in the above-described three directions, and subsequently, residual stress was determined. It is noted that, with reference to rr direction and θθ direction, the determination of the residual stress was conducted by an iso-inclination method in which scan axes are disposed in a manner parallel to each other as well as a side inclination method in which scan axes are disposed in a manner orthogonal to each other.

As described above, the residual stress (σ) can be evaluated by the slope ($\Delta(2\theta)/\Delta(\sin^2\Psi)$) of a straight line fitted to data points by least square approximation which are obtained by X-ray diffraction and plotted onto a $2\theta$-$\sin^2\Psi$ diagram.

Primarily, the value of Young's modulus regarding to polycrystalline silicon that is a sample actually used for determination should be employed as Young's modulus E. However, a literature value of Young's modulus regarding to <111> orientation of the single-crystalline silicon, that is, 171.8 GPa was employed due to a certain reason, for example, the fact that Young's modulus cannot be calculated with taking the abundance of all types of crystal orientation into account.

As described above, the absence of the internal stress leads to no shift of diffraction peak, and the presence of the compressive stress (the reference sign for this stress is "−") leads to the shift of diffraction peak to the higher angle direction, and the presence of the tensile stress (the reference sign for this stress is "+") leads to the shift of diffraction peak to the lower angle direction. In a comparison of a plurality of polycrystalline silicon rods grown by the Siemens process under different conditions, and with reference to the polycrystalline silicon rods likely to undergo cracking inside a furnace (or the polycrystalline silicon rods that have been underwent cracking inside a furnace), an area with tensile stress and an area with an compressive stress were present in a mixed manner. On the contrary, in polycrystalline silicon rods less likely to undergo cracking inside a furnace, only an area with compressive stress was detected, and an area with tensile stress was not detected.

[Conditions Concerning Heat Treatment]

When the deposition of polycrystalline silicon was completed, the polycrystalline silicon rods were heat-treated inside a furnace. In particular, the above heat treatment was conducted only by heating using radiant heat for one to two hours while the surface temperatures of the above polycrystalline silicon rods were controlled to 750° C., without supplying electric power to the silicon core wire. It is noted that heat treatment was conducted under hydrogen atmosphere, and the surface temperatures of the polycrystalline silicon rods were monitored by a radiation thermometer (at wave length of 0.9 μm).

The above disk-shaped samples were sampled from the polycrystalline silicon rods after the above-described heat treatment to determine residual stress and as a result of this, the residual stress was found to be not more than +20 MPa in all of the three directions described above.

When the temperature of heat treatment inside a furnace was from 800° C. to 900° C. (for one to two hours, in each case), residual stresses of not more than +20 MPa were also confirmed in all of the three directions described above.

When the above-described polycrystalline silicon rods with residual stress of not more than 20 MPa were used as a raw material to grow single-crystalline silicon by the FZ method, in all of the polycrystalline silicon rods, single-crystalline silicon was obtained without any cracking, fracture, and dropping of the polycrystalline silicon rods in the FZ device.

It is noted that, when the deposition of the polycrystalline silicon was completed, the polycrystalline silicon rods were temporarily removed from the furnace, and subsequently, were heat-treated inside another furnace, and thus, results similar to the above-described results were achieved.

[Physical Properties Before and After the Heat Treatment]

Residual stress in the polycrystalline silicon rods that have not been heat-treated was determined, and samples for evaluation of the physical properties were sampled in the above-described three directions with respect to each of the polycrystalline silicon rods. It is noted that the sample has a diameter of 19 mm and the thickness of 2 mm.

The-above-described samples were heat-treated at four conditions, that is, at 750° C. for 2 hours, at 800° C. for 2 hours, at 850° C. for 2 hours, and at 900° C. for 2 hours, and subsequently, changes in the residual stress, crystal structure, crystal grain size distribution, and thermal diffusivity after the heat treatment were studied.

In particular, the sample is fixed at a position with an angle that gives 2θ peak at <111>, <220>, <331>, and <400> regarding to each sample surface, and subsequently, change in the crystal structure was judged by checking if change in the amount of the detected diffraction peaks and change in the peak shapes was observed with checking all orientations within the rotating direction of sample surface from 0° to 180° or from 0° to 360°. It is noted that the detail of the above determination method is described in Patent Literature 4 (Japanese Patent Laid-Open No. 2013-217653). It is noted that the amount of the detected diffraction peaks is expressed by baseline value of the background and the number of peaks; however, when the value of the amount of the detected peaks themselves does not significantly differ from the background value, the physical properties of the crystal depend on the background. It is noted that, if the amount of the detected peaks is not negligible relative to a background value, the absolute amount of the detected peak has to be additionally evaluated.

With reference to each sample surface, change in the crystal grain size distribution was determined by electron back scattering diffraction (EBSD) patterns. It is noted that the determination method of change in the crystal grain size distribution is described in Patent Literature 5 (Japanese Patent Laid-Open No. 2014-31297).

Change in the thermal diffusivity at normal temperature was determined with respect to each sample surface. It is noted that the determination method of the thermal diffusivity at normal temperature is described in Patent Literature 6 (Japanese Patent Laid-Open No. 2014-34506).

As a result of the above determination, it was confirmed that heat treatment at a relatively low temperature of 750° C. can satisfactorily relieve the residual stress, and was also confirmed that, with reference to heat treatment at a temperature of not more than 900° C., the polycrystalline silicon rod after heat treatment retains the crystal structure, crystal grain size distribution and thermal diffusivity before the heat treatment.

EXAMPLES

Eight polycrystalline silicon rods (diameter of 140 mm) that were deposited by the Siemens process and have not been heat-treated were provided, and heat-treated under the following conditions, and subsequently, samples to be evaluated with a diameter of 19 mm and a thickness of 2 mm were sampled in the above-described three directions of each silicon rod, and then, samples (E1 and E4) heat-treated inside the deposition furnace, samples (E2, E3, and C4) heat-treated outside the deposition furnace, and samples (C1, C2, and C3) that have not been heat-treated were prepared.

Among the above samples, the sample E1 was heat-treated at 750° C. inside a deposition furnace, the sample E2 was heat-treated at 750° C. outside a deposition furnace, the sample E3 was heat-treated at 900° C. outside a deposition furnace, and the sample E4 was heat-treated at 850° C. inside a deposition furnace. Any one of the samples C1, C2, and C3 has not been heat-treated after the deposition process. Furthermore, the sample C4 was heat-treated at 720° C. outside the deposition furnace after the deposition process. The relevant conditions and the like are summarized in Table 1 and Table 2. It is noted that "BG" in the Tables is an abbreviation for the amount of the detected peaks of the background. Furthermore, "Peak/180° " means the number of peaks that are detected during the rotation by 180° at a diffraction angle of Miller index of interest.

It is observed that, while any one of the samples (E1, E2, E3, and E4) heat-treated within a temperature range from 750° C. to 900° C. has residual stress (σ) of not more than +20 MPa, the samples (C1, C2, and C3) without any heat treatment have residual stress (σ) of greater than +20 MPa. Furthermore, the sample C4 heat-treated at a temperature below 750° C. after the deposition process can be seen to tend to have lower residual stress than the residual stress of the samples without heat treatment; however, the residual stress (σ) of sample C4 is still greater than +20 MPa.

"Fracture" at the bottom of Table 1 and Table 2 means (the presence and absence of) the fracture of the polycrystalline silicon rod inside a furnace when a single crystal is grown by FZ method using a polycrystalline silicon rod as a raw material. Polycrystalline silicon rods (E1, E2, E3, and E4) with residual stress (σ) of not more than +20 MPa caused no "fracture"; however, polycrystalline silicon rods (C1, C2, C3, and C4) with residual stress (σ) of greater than +20 MPa caused "fracture".

TABLE 1

| properties and the like | units and the like | E1 | E2 | E3 | E4 |
|---|---|---|---|---|---|
| diameter | mm | 140 | 140 | 140 | 140 |
| heat-treatment furnace | inside/outside | inside | outside | outside | inside |
| heat treatment | ° C. | 750 | 750 | 900 | 850 |
| | time | 1 | 3 | 2 | 1 |
| residual stress | rr direction MPa | −5 | 20 | 16 | −120 |
| | θθ direction MPa | 20 | 19 | 5 | −130 |
| | zz direction MPa | 20 | 19 | 7 | −40 |
| XRD | <111> BG kcps | 11 | 10 | 9.5 | 11 |
| | <220> BG kcps | 10 | 11 | 11 | 9 |
| XRD | <111> peak/180° | 0 | 2 | 8 | 0 |
| | <220> peak/180° | 14 | 5 | 13 | 15 |
| thermal diffusivity | mm²/s (cross-sectional domain in the direction of growth) | 74 | 78 | 79 | 73 |
| crystal average grain size | μm (cross-sectional domain in the direction of growth) | 5.2 | 7.3 | 8.4 | 4.6 |
| fracture | present/absent | absent | absent | absent | absent |

TABLE 2

| properties and the like | units and the like | C1 | C2 | C3 | C4 |
|---|---|---|---|---|---|
| diameter | mm | 140 | 140 | 140 | 140 |
| heat-treatment furnace | inside/outside | — | — | — | outside |
| heat treatment | ° C. | — | — | — | 720 |
| | time | — | — | — | 3 |
| residual stress | rr direction MPa | 25 | 70 | 70 | 21 |
| | θθ direction MPa | 30 | −10 | −10 | 23 |
| | zz direction MPa | 22 | 30 | 30 | 14 |
| XRD | <111> BG kcps | 11 | 10 | 10 | 10 |
| | <220> BG kcps | 9 | 10 | 11 | 11 |
| XRD | <111> peak/180° | 0 | 0 | 0 | 1 |
| | <220> peak/180° | 0 | 0 | 9 | 3 |
| thermal diffusivity | mm²/s (cross-sectional domain in the direction of growth) | 77 | 74 | 75 | 76 |
| crystal average grain size | μm (cross-sectional domain in the direction of growth) | 6 | 7.3 | 7.1 | 7.5 |
| fracture | present/absent | present | present | present | present |

According to the data collected by the present inventors, in both the central and surface portions of the polycrystalline silicon rod fractured inside the FZ furnace, large tensile stresses from +30 MPa to +70 MPa are detected in the three directions of the rr direction, θθ direction, and zz direction. On the other hand, if tensile stresses in all the three directions of the rr direction, θθ direction, and zz direction are not more than +20 MPa, the above-described fracture is concluded not to occur.

INDUSTRIAL APPLICABILITY

The present invention is based on a new finding of the present inventors that residual stress in a polycrystalline silicon rod grown by the Siemens process can be relieved by heat treatment at a relatively low temperature within a temperature range from 750° C. to 900° C. As a result, a polycrystalline silicon rod with residual stress (σ) of not more than +20 MPa evaluated by X-ray diffraction is provided.

The present invention allows to release and relieve residual stress in a polycrystalline silicon rod without changing the physical properties of the polycrystalline silicon rod after a growing process, so that the polycrystalline silicon rod has residual strain reduced to such an extent that no problems due to cracking can occur when single-crystalline silicon used for producing, e.g., a certain device is manufactured such as by silicon-recharging process.

REFERENCE SIGNS LIST

1 Silicon core wire
10 Polycrystalline silicon rod
11 Rod
12 Disk
20 Disk-shaped sample

The invention claimed is:
1. A method of producing a polycrystalline silicon rod, comprising:
  (i) growing a polycrystalline silicon rod by a Siemens process, and
  (ii) after said growing, heat-treating the polycrystalline silicon rod, which was grown, at a temperature ranging from 750° C. to 900° C. for stress relief,
 wherein said heat-treating is conducted inside a furnace in which the polycrystalline silicon rod was grown and
 wherein said heat-treating occurs in absence of growing the polycrystalline silicon rod.

* * * * *